United States Patent [19]
Nagasawa et al.

[11] Patent Number: 4,792,841
[45] Date of Patent: Dec. 20, 1988

[54] SEMICONDUCTOR DEVICES AND A PROCESS FOR PRODUCING THE SAME

[75] Inventors: Kouichi Nagasawa, Kunitachi; Yoshio Sakai, Hachiohji; Osamu Minato, Kodaira; Toshiaki Masuhara, Tokyo; Satoshi Meguro, Kodaira, all of Japan

[73] Assignee: Hitachi, Ltd., Tokyo, Japan

[21] Appl. No.: 634,037

[22] Filed: Jul. 24, 1984

Related U.S. Application Data

[63] Continuation of Ser. No. 288,466, Jul. 30, 1981, abandoned.

[30] Foreign Application Priority Data

Aug. 15, 1980 [JP] Japan .................. 55-111705

[51] Int. Cl.$^4$ .................. H01L 29/04
[52] U.S. Cl. .................. 357/59; 357/71; 357/41; 357/51; 365/182
[58] Field of Search .................. 357/59, 65, 23.9, 23.1, 357/71, 68, 41, 59 G, 59 J, 71 P, 41, 51; 365/182

[56] References Cited

U.S. PATENT DOCUMENTS

| | | | |
|---|---|---|---|
| 3,967,364 | 7/1976 | Kawamoto | 357/59 |
| 4,246,593 | 1/1981 | Bartlett | 357/41 |
| 4,291,322 | 9/1981 | Clemens | 357/71 S |
| 4,326,213 | 4/1982 | Shirai | 357/23.9 |
| 4,395,723 | 7/1983 | Harari | 357/23.4 |
| 4,558,343 | 12/1985 | Aritzumi et al. | 357/59 J |
| 4,586,238 | 5/1986 | Yatsuda | 29/571 |

FOREIGN PATENT DOCUMENTS

| | | |
|---|---|---|
| 0002364 | 6/1979 | European Pat. Off. . |
| 0029099 | 5/1981 | European Pat. Off. . |
| 0002166 | 1/1977 | Japan .................. 357/71 R |
| 0063982 | 6/1978 | Japan .................. 357/59 |
| 0111792 | 1/1979 | Japan .................. 357/59 |
| 54-14690 | 2/1979 | Japan . |
| 5440580 | 3/1979 | Japan . |
| 55-72069 | 5/1980 | Japan .................. 357/41 |
| 8203948 | 11/1982 | PCT Int'l Appl. . |
| 2017402 | 10/1979 | United Kingdom . |
| 2092826 | 8/1982 | United Kingdom . |

OTHER PUBLICATIONS

Osone, "64-KBIT NMOS Static RAM," *Denshi Zaiyro*, pp. 43-49, Jun. 1980.
Japanese Kohai 52-18114, May 1977 (5/77).
IEEE Journal of Solid State Circuits, vol. SC-18, #5, Oct. 1983 by Sood et al., pp. 498-508.
IEEE Journal of Solid State Circuits, vol. SC-15, #5, Oct. 1980 by Ohzone et al., pp. 854-861.
IEEE Journal of Solid State Circuits, vol. SC-15, #2, Apr. 1980, pp. 201-205 by Ohzone.

*Primary Examiner*—Andrew J. James
*Assistant Examiner*—Mark Prenty
*Attorney, Agent, or Firm*—Antonelli, Terry & Wands

[57] ABSTRACT

Disclosed is an MOSIC including a plurality of silicon gate type MOSFET's in which, after the polycrystalline silicon wirings are formed simultaneously with polycrystalline silicon gates, electrodes contacted with the source and drain regions are made of polycrystalline silicon so as to be connected to the polycrystalline silicon wirings, thereby to prevent the shallow pn junctions of the source and drain regions from being destroyed by the contacts and to provide a high degree of integration to one silicon chip.

29 Claims, 8 Drawing Sheets

SEMICONDUCTOR DEVICES AND A PROCESS FOR PRODUCING THE SAME

This is a continuation of application Ser. No. 288,466, filed July 30, 1981 and now abandoned.

BACKGROUND OF THE INVENTION

The present invention relates to semiconductor devices and a process for producing the same. In particular, the invention relates to static memory semiconductor devices employing FET's (field effect transistors) and a process for producing them.

A memory portion of a static memory semiconductor device consists of a plurality of memory cells, each memory cell being made up of a plurality of MOS FET's. In a static memory cell of this type, the electrode has heretofore been connected to the source region or to the drain region of the MOS FET by using an aluminum wiring. However, since the memory portion occupies a very wide area in a chip in which the static memory semiconductor device is formed, the area occupied by the memory portion must be reduced if it is desired to increase the degree of integration of the semiconductor devices. In an attempt to reduce the area of the memory portion or to reduce the size of the memory cell, therefore, attempts have been made to connect a wiring 8 of polycrystalline silicon directly to the source region or the drain region 7 that is surrounded by a field $SiO_2$ film 5 and a polycrystalline silicon gate 6, as shown in FIGS. 1 and 2. However, the polycrystalline silicon wiring 8 is composed of a first layer that is formed simultaneously with the polycrystalline silicon gate 6, and is usually doped with phosphorus ions of a high concentration to reduce the resistance. The phosphorus ions are doped simultaneously with the formation of the source region and the drain region. While the phosphorus ions are being doped, the depth of an $n^+$-type diffusion layer 7 increases beneath the polycrystalline silicon wiring. Namely, the diffusion layer 7 swells beneath the polycrystalline silicon gate 6 as indicated by a dotted line 10 in FIG. 2, and it becomes difficult to obtain an MOSFET having a desired channel length or a desired shallow source region or drain region. To prevent this defect, a sufficient distance $d_1$ must be provided between an end portion of the polycrystalline silicon gate 6 and an end portion of the polycrystalline silicon wiring 8. This, however, contradicts the purpose of reducing the size of the cell; the degree of integration of the semiconductor devices is not increased.

Therefore, the inventors of the present invention have developed a method by which the polycrystalline silicon gate 6 and the polycrystalline silicon wiring 8 are formed as shown in FIG. 3, and are covered by an insulating film 9 such as PSG (phosphorus silicate glass). A portion of the insulating film 9 is then selectively removed by photoetching, and an aluminum wiring 10 is formed in order to connect a semiconductor region 7 to the polycrystalline silicon wiring 8. It was, however, discovered that when the aluminum layer is brought into direct contact with the semiconductor region (source or drain region), there is formed an aluminum-silicon alloy which destroys a pn junction at a depth of as small as about 1 $\mu$m in the source or the drain region.

SUMMARY OF THE INVENTION

The present invention is to solve the above-mentioned defects and problems.

A first object of the present invention therefore is to provide an MOSFET which enables the degree of integration to be increased.

A second object of the present invention is to provide a process for producing such MOSFET's.

A third object of the present invention is to provide a memory cell having a high degree of integration.

DESCRIPTION OF THE PREFERRED EMBODIMENTS

Figure 1:
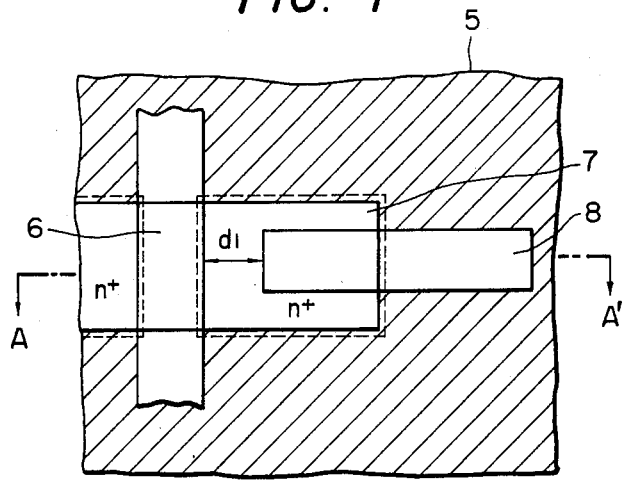
FIG. 1 is a plan view showing a portion of an MOSFET which is used for a conventional memory cell.
Figure 2:
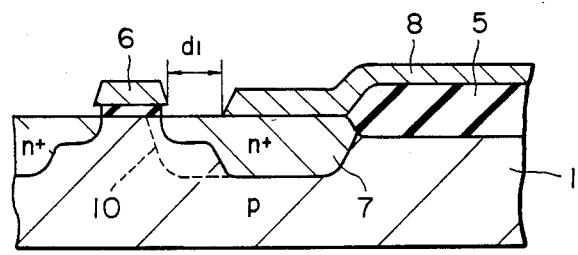
FIG. 2 is a section view along the line A—A' of FIG. 1.
Figure 3:
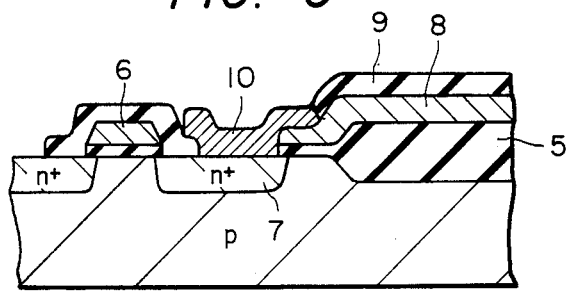
FIG. 3 is a section view of an MOSFET developed by the inventors of the present invention, which serves as a prerequisite for the present invention.
Figure 4:
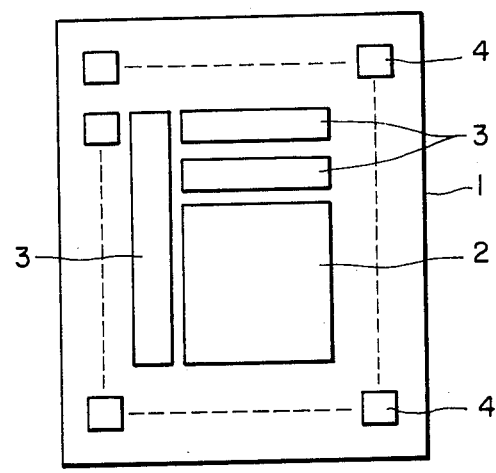
FIG. 4 is a plan view showing the construction of a static memory device according to the present invention.

Referring to FIG. 4, a static memory device according to the present invention has a memory portion (memory array) 2 which consists of a plurality of single-channel (for example, n-channel) MOSFET's formed in a well region that is formed in a portion of a silicon semiconductor chip 1. A peripheral circuit 3 consisting of complementary MOSFET's is formed by the side of the memory portion 2 to drive it. Further, a required number of bonding pads (terminals) 4 are formed in the periphery of the chip 1.

Figure 5:
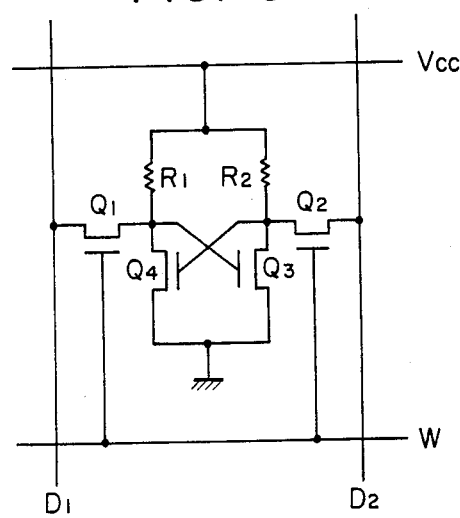
FIG. 5 is a circuit diagram of a memory cell in the memory device.

A memory cell of a single bit consists of four MOSFET's $Q_1$, $Q_2$, $Q_3$ and $Q_4$, and load resistors $R_1$ and $R_2$, as shown in FIG. 5, in whic $V_{CC}$ denotes a power supply of a voltage of, for example, +5 volts, W denotes a word line, and $D_1$ and $D_2$ denote data lines.

Figure 6:
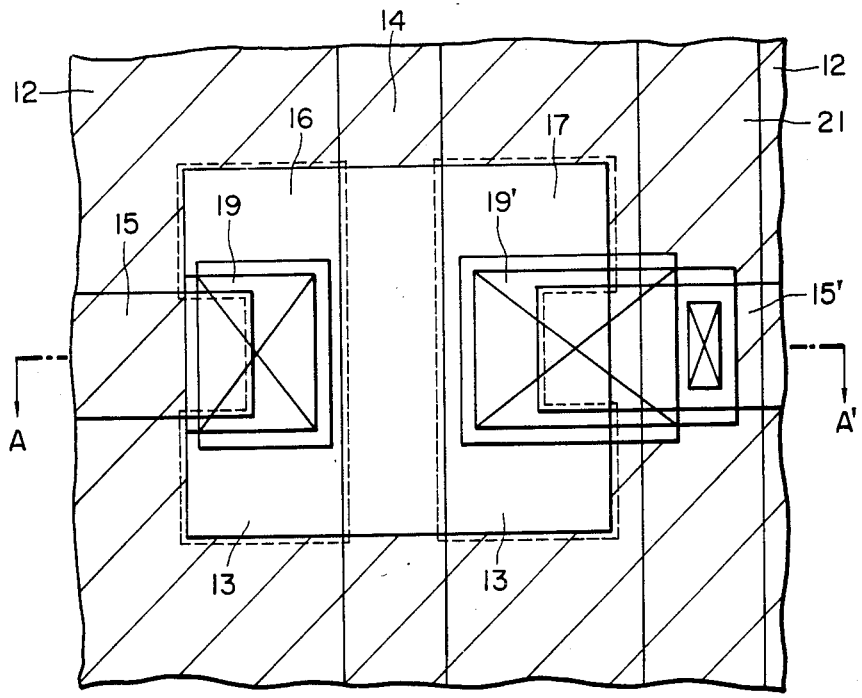
FIG. 6 is a plan view of an MOSFET according to an embodiment of the present invention.
Figure 7:
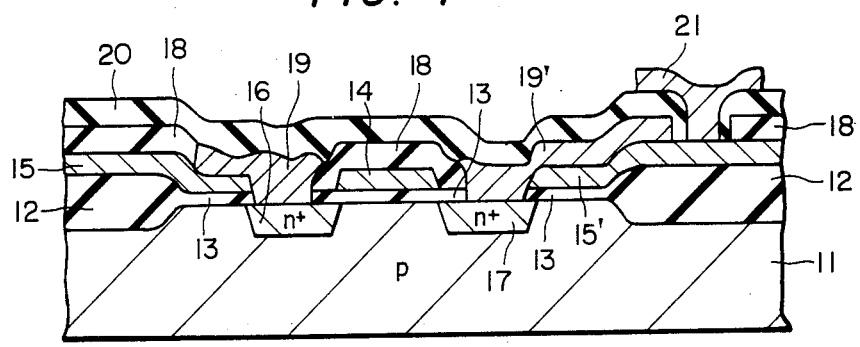
FIG. 7 is a section view of the MOSFET along the line A—A' of FIG. 6.

FIG. 6 is a plan view of an MOSFET which constitutes a memory cell of FIG. 5, and FIG. 7 is a section view along the line A—A' of FIG. 6. In FIGS. 6 and 7, an $SiO_2$ film (gate insulation film) 13 of a thickness smaller than a field $SiO_2$ film 12 is formed on the surface of a region (active region) in a portion of a p-type substrate that is surrounded by the thick field $SiO_2$ film 12. On the $SiO_2$ film 13 is selectively formed a gate polycrystalline silicon layer 14 in a manner to traverse the active region. Further, polycrystalline silicon wirings 15 and 15' of the first layer are selectively formed so as to stretch from the SiO₂ film 13 to the field SiO₂ film 12 in a direction to cross the gate polycrystalline silicon layer 14 at right angles thereto. An n⁺-type source region 16 and an n⁺-type drain region 17 are formed in the surface of the active region which is surrounded by the gate polycrystalline silicon layer 14, field SiO₂ film 12, and polycrystalilne silicon wirings 15, 15' of the first layer. Further, there are formed a second polycrystalline silicon wiring layer 19 that comes into direct contact with a portion of the surface of said source region 16 and with a portion of the surface of the first polycrystalline silicon wiring layer 15, and a second polycrystalline silicon wiring layer 19' that comes into direct contact with a portion of the surface of the drain region 17 and with a portion of the surface of the first polycrystalline silicon wiring layer 15'. An aluminum wiring 21 is connected to the first polycrystalline silicon wiring layer 15'.

FIGS. 8(a) to 8(f) are section views showing the steps in a process for producing the MOSFET that is shown in FIGS. 6 and 7. The process for producing the MOSFET of FIGS. 6 and 7 will be described below in conjunction with FIGS. 8(a) to 8(f).

Figure 8A:
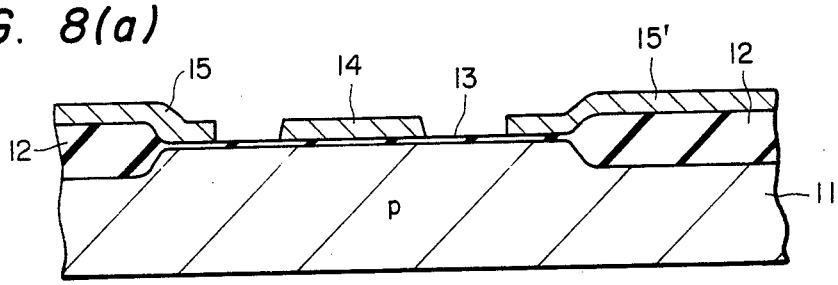
FIG. 8(a) to 8(f) are section views showing the steps in a process for producing the MOSFET of FIG. 7.

Referring to FIG. 8(a), first, a field SiO₂ film 12 is formed on one main surface of a p-type silicon substrate 11 by the low-temperature selective oxidation method, and an SiO₂ film (gate insulation film) 13 of a thickness smaller than that of the field SiO₂ film 12 is formed on the surface of the active region surrounded by the field SiO₂ film 12. Then, polycrystalline silicon is deposited on the whole surfaces of the field SiO₂ film 12 and the gate SiO₂ film 13, and is doped with phosphorus ions of a relatively high concentration to decrease its resistance. The polycrystalline silicon is then subjected to the selective photoetching, in order to form a polycrystalline silicon gate 14 and first polycrystalline silicon wiring layers 15, 15'.

Figure 8B:
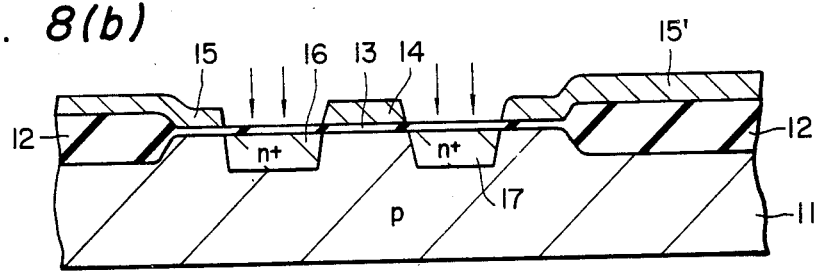

Referring to FIG. 8(b), n-type impurities are introduced into the surface of the p-type silicon substrate 11 with the polycrystalline silicon gate 14 and first polycrystalline silicon wiring layers 15, 15' as a mask, in order to form, in the p-type substrate, a semiconductor region that forms a pn junction relative to the substrate. For instance, n-type impurity ions of phosphorus or arsenic are injected into the p-type silicon substrate 11, followed by the annealing (heat treatment), to form the n⁺-type source region 16 and drain region 17 having a desired depth in the p-type silicon substrate 11.

Figure 8C:
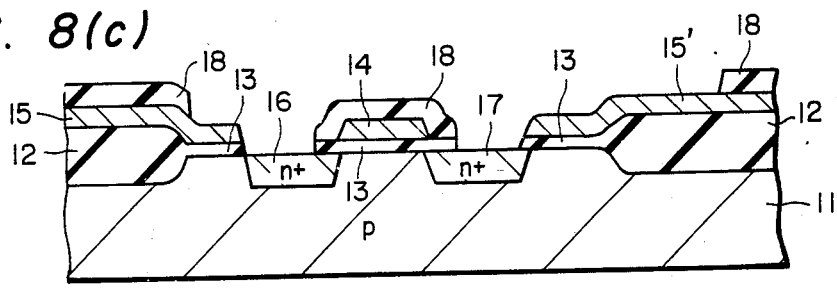

Referring to FIG. 8(c), an SiO₂ film 18 is formed as a first inerlayer insulation film on the whole surface of the p-type substrate 11 by the thermal oxidation method or the CVD (chemical vapor deposition) method. Then, portions of the surface of the source region 16 and the drain region 17 are exposed by the contact photoetching.

Figure 8D:
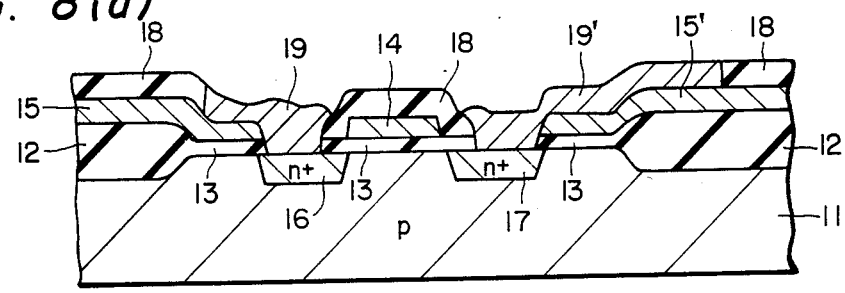

Referring to FIG. 8(d), a second polycrystalline silicon layer is deposited on the whole surface of the substrate 11, and is doped with phosphorus ions of a relatively small concentration. Then, unnecessary portions of the polycrystalline silicon are removed by the patterning. Thus, there are formed second polycrystalline silicon wiring layers 19, 19' to connect the source region 16 and the drain layer 17 to the first polycrystalline silicon wiring layers 15, 15'.

Figure 8E:
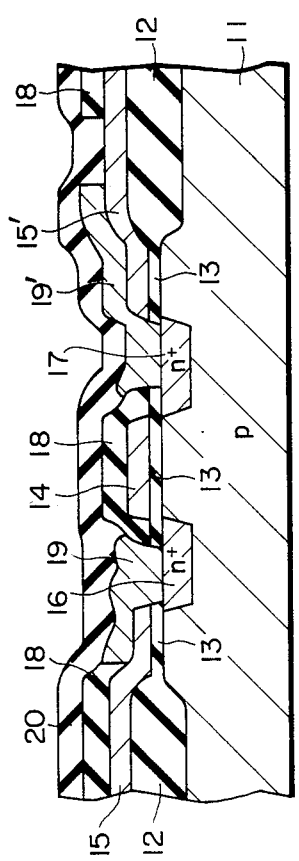

Referring to FIG. 8(e), the first polycrystalline silicon wiring layer 15' is selectively exposed and, then, a PSG (phosphrous silicate glass) film 20 is deposited on the whole surface of the p-type substrate 11 to form a second interlayer insulation film (or passivation film).

Figure 8F:
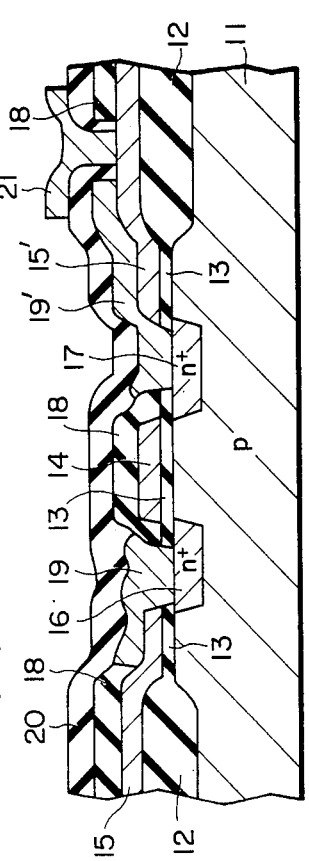

Referring to FIG. 8(f), portions of the second interlayer insulation film 20 are selectively removed, and an aluminum wiring (third wiring) 21 which connects to the second polycrystalline silicon wiring layer is formed by vaporizing aluminum.

According to the present invention which makes use of a polycrystalline silicon wiring layer (second polycrystalline silicon wiring layer) in addition to the gate wiring layer (first polycrystalline silicon wiring layer) and electrode wiring of aluminum as mentioned above, it is possible to connect the first polycrystalline silicon wiring layer to a semiconductor region such as source region or drain region selectively formed in the substrate via the second polycrystalline silicon wiring layer. Therefore, there is no need to deeply form the semiconductor region, or to increase the distance between the gate wiring 14 and the first polycrystalline silicon wiring layers 15, 15', or between the gate wiring 14 and the second polycrystalline silicon wiring layers 19, 19'. Consequently, the degree of integration of the semiconductor devices can be increased. Further, since aluminum is not directly connected to the diffusion layer, there takes place no Al-si reaction which destroys the pn junction.

Figure 9:
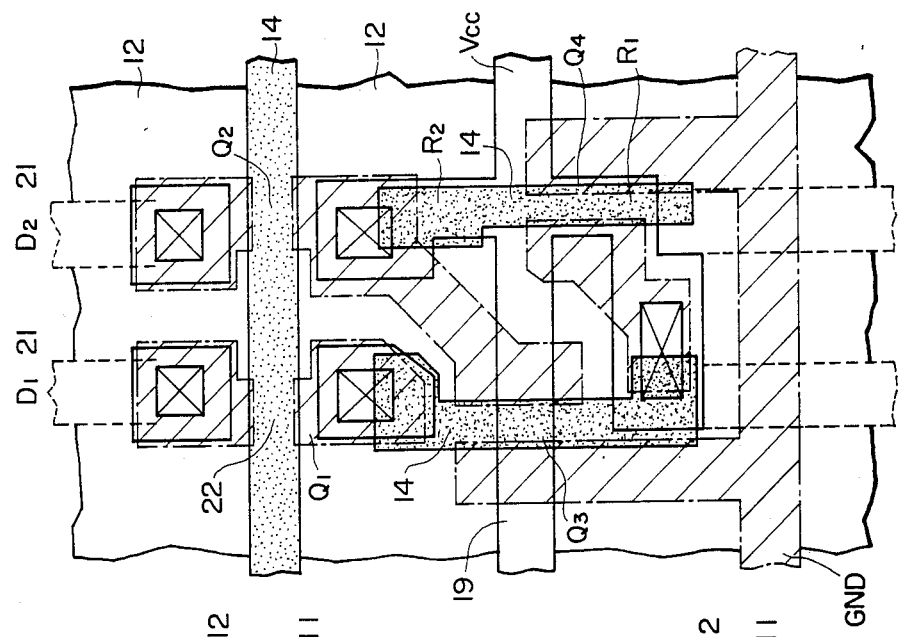
FIG. 9 is a plan view of the memory cell of FIG. 5 formed in accordance with the present invention.

FIG. 9 is a plan view of a static memory cell according to the present invention, which constitutes the circuit of the memory cell of FIG. 5. In FIG. 9, portions surrounded by a dot-dash line serve as active regions that are surrounded by the filed insulation film 12, most of the regions thereof being diffusion regions (source and drain regions). A portion of the diffusion region is connected to ground line GND.

A solid line 14 denotes a first polycrystalline silicon wiring layer (gate wiring layer). A portion of the active region which crosses the wiring layer 14 works as a channel portion 22. MOS memory portions $Q_1$, $Q_2$, $Q_3$ and $Q_4$ are thus formed. A portion surrounded by a solid line 19 denotes a second polycrystalline silicon wiring layer which is connected to the first polycrystalline silicon wiring layer 14 via diffusion regions of $Q_1$ and $Q_2$, and a contact portion. Portions of the second polycrystalline silicon wiring layer 19 serve as high resistances $R_1$, $R_2$, and are inserted between $Q_3$ and $Q_4$ and are connected to the power supply $V_{CC}$. Portions $D_1$, $D_2$ surrounded by a broken line serve as data lines consisting of an aluminum wiring 21, and are connected to the diffusion regions of $Q_1$ and $Q_2$ via a contact portion of the second polycrystalline silicon layer that is superposed on the diffusion region.

In the thus constructed memory cell, the second polycrystalline silicon wiring layer is used for the power supply. Therefore, the impurities are doped in such small amounts that they do not affect the diffusion region. Accordingly, the depth of the source and drain regions is reduced, and the channel length of the gate portion is reduced to increase the degree of integration.

FIGS. 10(a) to 10(f) are section views showing the steps in a process for producing an MOSFET which constitutes the memory of FIG. 5 according to another embodiment of the present invention.

Figure 10A:
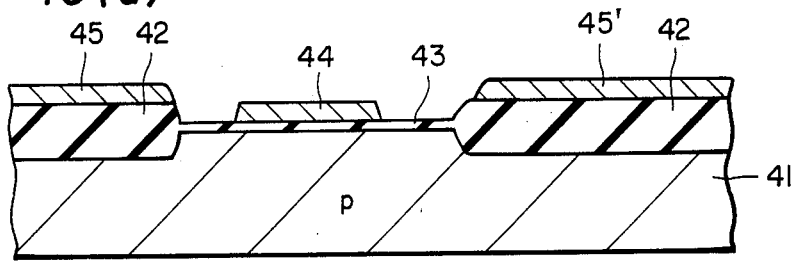
FIGS. 10(a) to 10(f) are section views showing the steps in a process for producing the MOSFET according to another embodiment of the present invention.

Referring to FIG. 10(a), a field SiO₂ film 42 is formed on one main surface of a p-type silicon substrate 41 by the low-temperature selective oxidation method, and an SiO₂ (gate insulation film) 43 having a thickness smaller than that of the field SiO₂ film 42 is formed on the surface of the active region surrounded by the field SiO₂ film 42. Then, polycrystalline silicon is deposited on the whole surfaces of the field SiO$_2$ film 42 and the gate SiO$_2$ film 43, and is doped with phosphorus ions of a relatively high concentration to reduce its resistance. The polycrystalline silicon is then subjected to the selective photoetching to form a polycrystalline silicon gate 44 and first-layer polycrystalline silicon wirings 45, 45'. In this case, the polycrystalline silicon wir4ings 45, 45' are not permitted to stretch onto the gate SiO$_2$ film 43.

Figure 10B:
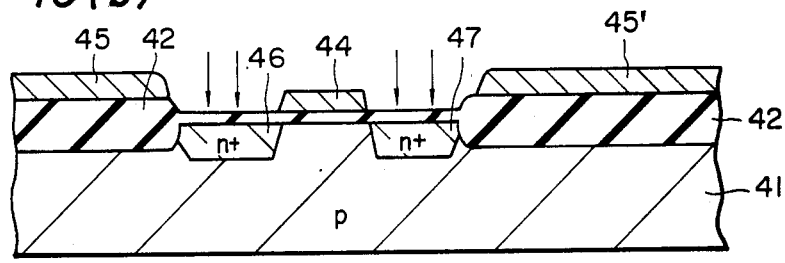

Referring to FIG. 10(b), n-type impurities are introduced into the surface of the p-type silicon substrate 41 with the polycrystalline silicon gate 44 and the field SiO$_2$ film 42 as a mask, thereby to form, in the p-type substrate, a semiconductor region that forms a pn junction with respect to the substrate. For example, n-type impurity ions such as phosphorus ions or arsenic ions are introduced into the p-type silicon substrate 41 by the ion injection, followed by annealing (heat treatment) to form the n$^+$-type source region 46 and drain region 47 having a desired depth in the p-type silicon substrate 41.

Figure 10C:
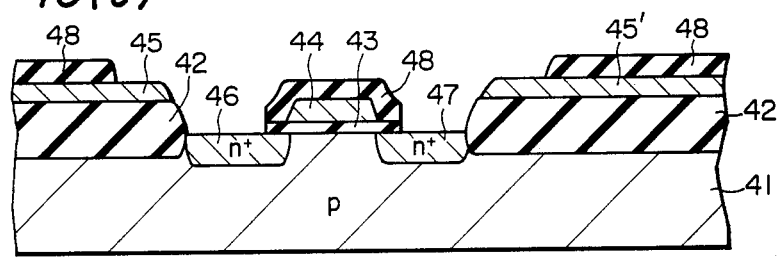

Referring to FIG. 10(c), an SiO$_2$ film 48 is formed as a first interlayer insulation film on the whole surface of the p-type substrate 41 by the thermal oxidation method or the CVD (chemical vapor deposition) method. Then, portions of the surface of the source region 46 and the drain region 47 are exposed by the contact photoetching. In this case, portions of the first polycrystalline silicon wiring layers 45, 45' are also exposed.

Figure 10D:
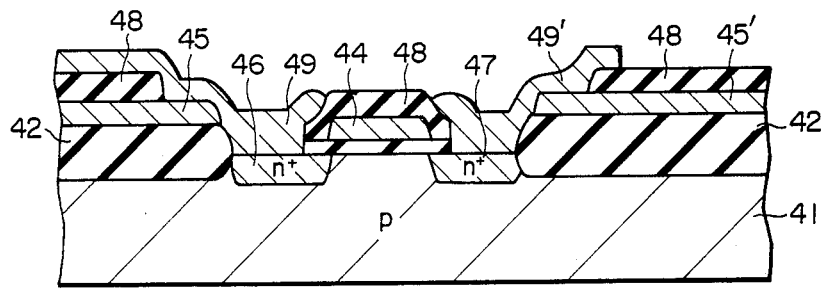

Referring to FIG. 10(d), a second polycrystalline silicon layer is deposited on the whole surface of the substrate 41, and is doped with phosphorus ions of a relatively small concentration. Thereafter, unnecessary portions of the polycrystalline silicon are removed by patterning. Thus, there are formed second polycrystalline silicon wiring layers 49, 49' to connect the source region 46 to the drain region 47, and to connect the first polycrystalline silicon wiring layers 45, 45' together.

Figure 10E:
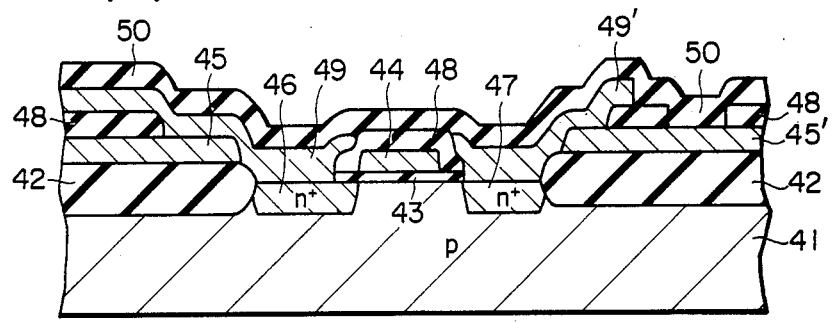

Referring to FIG. 10(e), the first polycrystalline silicon wiring layer 45' is selectively exposed, and a PSG (phosphorus silicate glass) film 50 is deposited on the whole surface of the p-type substrate 41 to form a second interlayer insulating film (or passivation film).

Figure 10F:
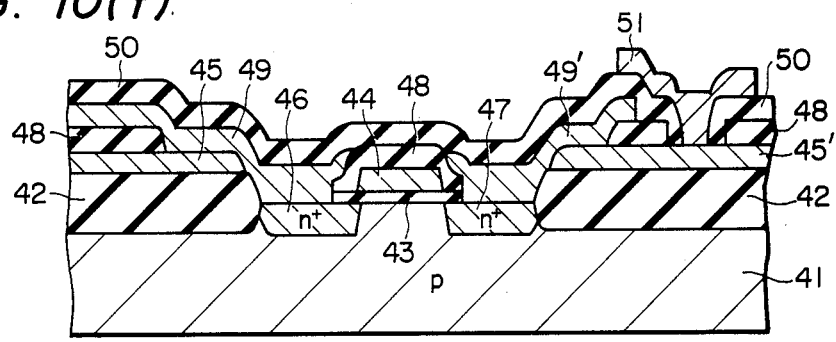

Referring to FIG. 10(f), a portion of the second interlayer insulation film 50 is selectively removed, and an aluminum wiring (third wiring) 51 which connects to the first polycrystalline silicon wiring layer 45' is formed by vaporizing aluminum.

According to the above-mentioned embodiment, the first polycrystalline silicon wiring layers 45, 45' are not permitted to stretch onto the gate SiO$_2$ film 43, but are terminated on the thick field SiO$_2$ film 42. Therefore, the areas of the source region 46 and the drain region 47 can be reduced. In other words, the degree of integration of memory cells can be increased.

FIGS. 11(a) to 11(f) illustrate a process when the present invention is adapted to the manufacture of a complementary MOSIC. This will be described below for each of the manufacturing steps.

Figure 11A:
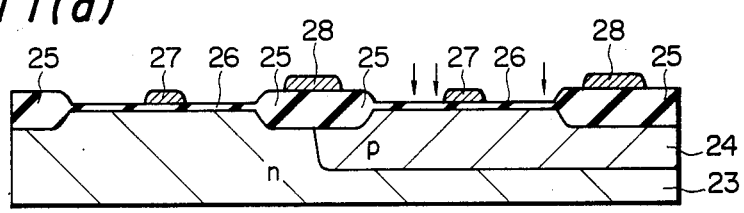
FIGS. 11(a) to 11(f) are section views showing the steps in a process for producing a CMOSIC according to the present invention.

Referring, first, to FIG. 11(a), boron ions are injected into a portion of the surface of an n-type silicon substrate 23 to form a p-type well region 24. A field SiO$_2$ film 25 is selectively formed on the surface of the n-type substrate 23 and the well region 24. Then, an SiO$_2$ film 26 of a thickness of about 380 angstroms is formed by gate oxidation on the surface of the n-type substrate 23 and the well region 24 that are surrounded by the field SiO$_2$ film 25. Then, the polycrystalline silicon is deposited to a thickness of about 3500 angstroms, and is doped with phosphorus ions (at 1000° C., for 5 minutes, 20 minutes and 5 minutes). A polycrystalline silicon gate 27 and a first polycrystalline silicon wiring layer 28 are formed by photoetching the polycrystalline silicon.

Figure 11B:
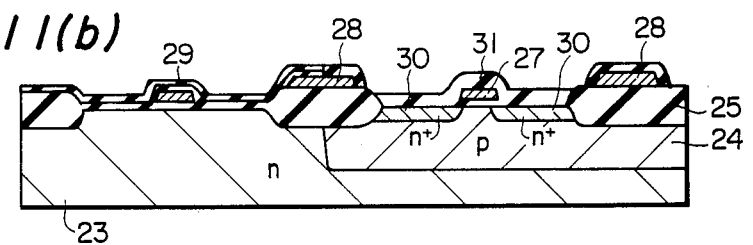

Referring to FIG. 11(b), the surfaces of the polycrystalline silicon gate 27 and the first polycrystalline silicon wiring layer 28 are lightly oxidized at a temperature of 850° C., and an Si$_3$N$_4$ is deposited on the whole surface of the substrate to a thickness of 1000 angstroms. Thereafter, only the Si$_3$N$_4$ is selectively removed by etching from the surface of the p-type well region 24. Namely, the Si$_3$N$_4$ film 29 is left on the surface of the n-type substrate 23 on which the p-type well region 24 has not been formed. Arsenic ions are introduced into the p-type well region by the injection method using the Si$_3$N$_4$ film 29 as a mask. Thereafter, an n$^+$-type source region or drain region 30 is formed by the annealing. Then, by using the Si$_3$N$_4$ film 29 as a mask for selective oxidation, the low-temperature selective oxidation is effected to increase the thickness of the SiO$_2$ film 31 on the surface of the polycrystalline silicon gate 27, first polycrystalline silicon wiring layer 28, and on the surface of the source or drain region 30.

Figure 11C:
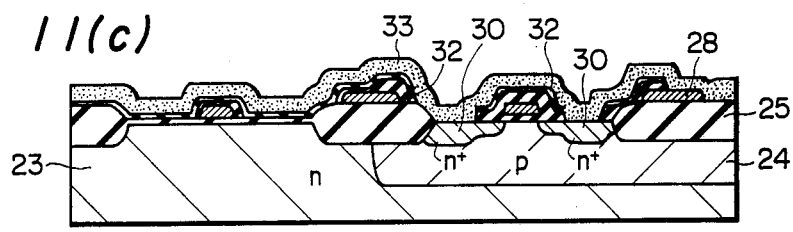

Referring to FIG. 11(c), the Si$_3$N$_4$ film 29 is removed by hot phosphoric acid, and an Si$_3$N$_4$ film 32 is newly deposited to a thickness of about 500 angstroms. A portion of the source or drain region 30 is exposed by effecting the contact photoetching onto the Si$_3$N$_4$ film 32 and the underlying SiO$_2$ film 31. A PSG (phosphorus silicate glass) film 33 is then deposited on the whole surfaces of the ntype substrate 11 and the well region 24, and is annealed at 1000° C. in a nitrogen atmosphere.

Figure 11D:
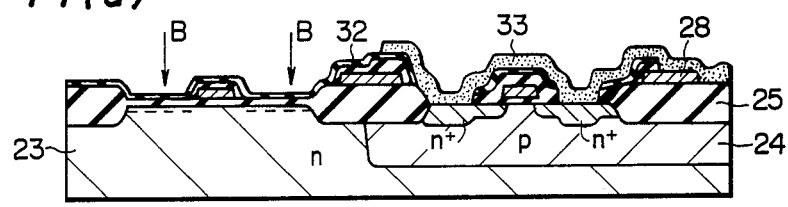

Referring to FIG. 11(d), a portion of the PSG film 33 is removed by etching, and boron ions are introduced into the p-channel side (n-type substrate) by the ion injection method through the Si$_3$N$_4$ film 32. Thus, the p-type source and drain regions 37 are formed.

Figure 11E:
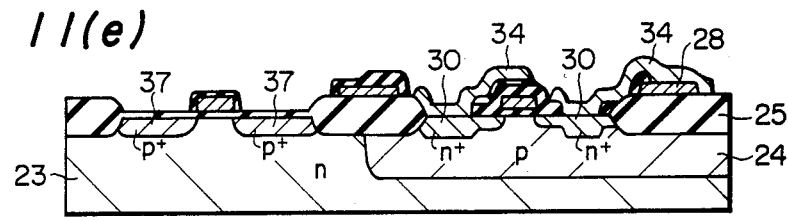

Referring to FIG. 11(e), the PSG film 33 is removed to expose the surface of the n$^+$-type diffusion region 30 and the first polycrystalline silicon wiring layer 28 on the n-channel side (p-well side). A second polycrystalline silicon layer 34 (3500 angstroms) is deposited on the p-channel side and on the n-channel side, and the polycrystalline silicon layer 34 is doped with phosphorus ions while masking the second polycrystalline silicon layer 34 on the p-channel side. Thereafter, unnecessary portions of the polycrystalline silicon layer 34 are removed by photoetching. Thus, the second polycrystalline silicon wiring 34 is formed which connects to the n$^+$-type region 30 and to the first polycrystalline silicon wiring layer 28.

Figure 11F:
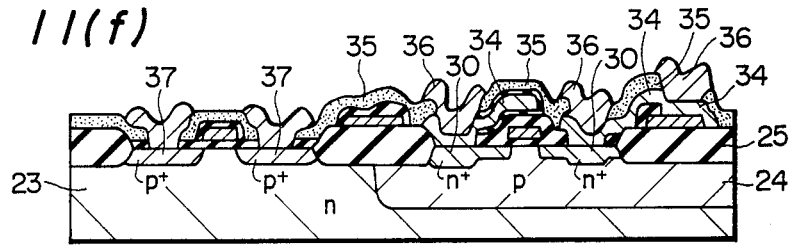

Referring to FIG. 11(f), the second polycrystalline silicon wiring layer 34 is lightly oxidized, a PSG film 35 is deposited thereon to a thickness of about 6000 angstroms. followed by annealing in a nitrogen atmosphere, and the films are selectively removed by the contact photoetching. Then, aluminum is deposited followed by patterning to form an aluminum wiring (electrode) 36 that connects to the p$^+$-type diffusion region 37 and to the second polycrystalline silicon wiring layer 34.

In the CMOS device obtained by the above-mentioned process, the aluminum wiring 36 is connected at a portion to the diffusion region (p$^+$) 37, and is connected at another portion to the diffusion region (n$^+$) 30 via the second polycrystalline silicon wiring layer 34. At still another portion, furthermore, the aluminum wiring 36 is connected to the first polycrystalline silicon wiring layer 28 via the second polycrystalline silicon wiring layer 34.

According to the present invention as mentioned in the foregoing, the first wiring layer or the third aluminum wiring layer is connected to the diffusion regions via the second wiring layer. Therefore, increased freedom is provided for laying out the wiring. Consequently, the degree of integrating the semiconductor devices can be increased, for example, by 10 to 20%.

The present invention can be effectively adapted to the MOS memory devices having polycrystalline silicon wirings of a multi-layer construction, and especially to static memory devices manufactured by the CMOS process.

What is claimed is:

1. A static random access memory semiconductor device formed on a semiconductor material comprising:
    a word line extending over said semiconductor material;
    a pair of data lines extending over said semiconductor material;
    a power supply line extending over said semiconductor material;
    a peripheral circuit comprising complementary MISFETs; and
    at least one memory cell fabricated in a surface region of said semiconductor material, said memory cell including first, second, third and fourth transistors, and a pair of load resistors, each of said transistors being of an insulated gate field effect type and having source and drain semiconductor regions formed in said semiconductor material and a gate;
    each of said gates of said first and second transistors being electrically connected to said drain semiconductor region of the other of said first and second transistors;
    one of said pair of load resistors being connected between the drain semiconductor region of said first transistor and said power supply line, and the other of said pair of load resistors being connected to the drain semiconductor egion of said second transistor and said power supply line;
    said third transistor being electrically coupled between said drain semiconductor region of said first transistor and one of said pair of data lines so that a current path from the source semiconductor region of the third transistor to the drain semiconductor region of the third transistor is formed between said drain semiconductor region of the first transistor and said one of said pair of data lines, said gate of said third transistor being formed as a part of said word line;
    said fourth transistor being electrically coupled between said drain semiconductor egion of said second transistor and the other of said pair of data lines so that a current path from the source semiconductor region of the fourth transistor to the drain semicondcutor region of the fourth transistor is formed between said drain semiconductor region of said second transistor and the other of said pair of data lines, said gate of said fourth transistor being formed as another part of said word line;
    said gates of said first and second transistors being respectively formed in first and second strips, of electrically conducting materials of a first level, which are extended on an insulating film formed over said semiconductor material;
    said power supply line being formed of a third strip, of polycrystalline silicon of a second level, which is extended on an insulating film formed over said semiconductor material; and
    said pair of load resistors being respectively formed in polycrystalline silicon of the second level as branches of said third strip, said polycrystalline silicon of the second level as branches of said third strip is formed integrally with said third strip forming said power supply line.

2. A static random access memory semiconductor device according to claim 1, wherein said first and second strips are extended substantially in parallel with each otehr in a direction, and said third step is extended in a direction substantially perpendicular to the direction in which said first and second strips are extended.

3. A static random access memory semiconductor device according to claim 2, wherein said word line is formed of a fourth strip, of the electrically conducting material of said first level, and is extended in the same direction as said third strip is extended.

4. A static random access memory semiconductor device according to claim 3, wherein said drain region of said first and second transistors are formed at an area of said semiconductor substrate which extends between said first and second strips.

5. A static random access memory semiconductor device according to claim 1, wherein said pair of data lines are made of aluminum, and extend in a direction substantially perpendicular to the direction in which said third strip is extended.

6. A static random access memory semiconductor device according to claim 1, wherein said electrically conducting materials for forming the first and second strips include polycrystalline silicon.

7. A static random access memory semiconductor integrated circuit device comprising:
    a semiconductor material of a first type of conductivity having a surface;
    a well region of a second type of conductivity, opposite to the first type of conductivity, which is selectively formed in a surface region of said semiconductor material, said well region having at least one memory cell provided therein, said at least one memory cell including MISFETs, the MISFETs having source and drain regions;
    semiconductor elements provided in a surface region of said semiconductor material, wherein the semiconductor elements provided in the surface region of said semiconductor material form a peripheral circuit for said at least one memory cell, said peripheral circuit having source and drain regions formed in the semiconductor material, the semiconductor elements forming the peripheral circuit including complementary MISFETs;
    at least one of said peripheral circuit and each of the memory cells including a first conductor layer, wherein the source and drain regions, of said at least one of said peripheral circuit and the memory cells including a first conductor layer, are formed in self-alignment with said first conductor layer;
    a second conductor layer constituting a wiring for said at least one of said peripheral circuit and the memory cells, the second conductor layer forming load resistors of the memory cells and a power supply line, whereby the load resistors and power supply line are integrally formed; and a third conductor layer, of metal, constituting a wiring for said at least one of said peripheral circuit and the memory cells, the third conductor layer being disposed over the second conductor layer.

8. A static random access memory semiconductor integrated circuit device according to claim 7, wherein said well region has a plurality of memory cells provided therein, each of the plurality of memory cells including MISFETs, the MISFETs included in each of the plurality of memory cells having source and drain regions.

9. A static random access memory semiconductor integrated circuit device comprising:
   a semiconductor material of a first type of conductivity having a surface;
   a well region of a second type of conductivity opposite to the first type of conductivity, which is selectively formed in a surface region of said semiconductor material, said well region having at least one memory cell provided therein, said at least one memory cell including MISFETs, the MISFETs having source and drain regions;
   semiconductor elements provided in a surface region of said semiconductor material, wherein the semiconductor elements provided in the surface region of said semiconductor material form a peripheral circuit for said at least one memory cell, said peripheral circuit having source and drain regions formed in the semiconductor material, the semiconductor elements forming the peripheral circuit including complementary MISFETs;
   at least one of said peripheral circuit and each of the memory cells including a first conductor layer, wherein the source and drain regions, of said at least one of said peripheral circuit and the memory cells including a first conductor layer, are formed in self-alignment with said first conductor layer;
   a second conductor layer constituting a wiring for said at least one of said peripheral circuit and the memory cells, the second conductor layer forming load resistors of the memory cells and a power supply line, whereby the load resistors and power supply line are integrally formed;
   a third conductor layer formed above said semiconductor material; and
   wherein said second conductor layer is formed to contact one of said source and drain regions of said peripheral circuit and each of said memory cells and to contact said third conductor layer, to provide electrical connection between said one of said source and drain regions and said third conductor layer.

10. A static random access memory semiconductor integrated circuit device according to claim 9, wherein said well region has a plurality of memory cells provided therein, each of the plurality of memory cells including MISFETs, the MISFETs included in each of the plurality of memory cells having source and drain regions.

11. A static random access memory semiconductor integrated circuit device according to claim 10, wherein said first conductor layer and said third conductor layer are formed of the same conductive material, and are simultaneously formed.

12. A static random access memory semiconductor integrated circuit device comprising:
   a semiconductor material of a first type of conductivity having a surface;
   a well region of a second type of conductivity, opposite to the first type of conductivity, which well region is selectively formed in a surface region of said semiconductor material, said well region having at least one memory cell provided therein, said at least one memory cell including MISFETs, the MISFETs having source and drain regions;
   semiconductor elements provided in a surface region of said semiconductor material, wherein the semiconductor elements provided in the surface region of said semiconductor material form a peripheral circuit for said at least one memory cell, said peripheral circuit having source and drain regions formed in the semiconductor material, the semiconductor elements forming the peripheral circuit including complementary MISFETs; and
   at least one of said peripheral circuit and each of the memory cells including a first conductor layer, wherein the source and drain regions, of said at least one of said peripheral circuit and the memory cells including a first conductor layer, are formed in self-alignment with said first conductor layer; and
   each of the memory cells including a second conductor layer which serves as load means for each of the memory cells and as a power supply line, whereby the load means and power supply line are integrally formed.

13. A static random access memory semiconductor integrated circuit device according to claim 12, wherein said first type of conductivity is N-type, said second type of conductivity is P-type, and said MISFETs are N-channel MISFETs formed in the well region of P-type.

14. A static random access memory semiconductor integrated circuit device according to claim 8, wherein said first type of conductivity is N-type, said second type of conductivity is P-type, and said MISFETs included in each of the plurality of memory cells are N-channel MISFETs formed in the well region of P-type.

15. A static random access memory semiconductor integrated circuit device according to claim 14, wherein said second conductor layer is made of polycrystalline silicon.

16. A static random access memory semiconductor integrated circuit device according to claim 10, further comprising a field insulating film formed to surround the surface of said semiconductor material and the well region in which the MISFETs included in each of the plurality of memory cells and semiconductor elements are formed, and wherein said third conductor layer is formed on said field insulating film.

17. A static random access memory semiconductor integrated circuit device according to claim 16, wherein said second conductor layer is made of polycrystalline silicon.

18. A static random access memory semiconductor integrated circuit device according to claim 17, wherein said third semiconductor layer is formed to be adjacent to said one of said source and drain regions with which it is in electrical connection.

19. A static random access memory semiconductor integrated circuit device according to claim 18, wherein said third conductor layer is formed on a part of said field insulating film adjacent said one of said source and drain regions with which it is in electrical connection.

20. A static random access memory smeiconductor integrated circuit device according to claim 19, wherein said well region has a plurality of memory cells provided therein, each of the plurality of memory cells including MISFETs, the MISFETs having source and drain regions.

21. A static random access memory semiconductor integrated circuit device formed on a semiconductor material, comprising:
  a plurality of memory cells, each memory cell having load resistors of polycrystalline silicon and a plurality of MISFETs;
  a peripheral circuit including complementary MISFETs; and
  a power supply line extending over the semiconductor material, with one of the load resistors of each memory cell being connected between a drain semiconductor region of one of the MISFETs of the memory cell and said power supply line, and with another of the load resistors of each memory cell being connected between a drain semiconductor region of another MISFET of the memory cell and said power supply line,
  wherein gate electrodes of the MISFETs in each memory cell are made from a first level conductive material layer, and the one and the another of the load resistors, and the power supply line, are made integrally from a second level conductive material layer of polycrystalline silicon.

22. A static random access memory semiconductor device according to claim 6, wherein the substrate is of a first conductivity type, and the at least one memory cell is in a well region, of a second conductivity type opposite the first conductivity type, in said substrate.

23. A static random access memory semiconductor device according to claim 22, wherein the first conductivity type is N-type, and the second type conductivity if P-type, whereby the memory cells include N-type MISFETs in a P-type well region in an N-type semiconductor substrate.

24. A static random access memory integrated circuit device according to claim 8, wherein the second conductor layer is of polycrystalline silicon, and is an upper level conductor layer as compared to the first conductor layer.

25. A static random access memory integrated circuit device according to claim 24, wherein the MISFETs of the at least one memory cell include gate electrodes, the gate electrodes being formed of said first conductor layer, the first conductor layer including a layer of polycrystalline silicon.

26. A static random access memory integrated circuit device according to claim 16, wherein the memory cells include said first conductor layer, the first conductor layer forming gate electrodes of the MISFETs of the memory cells and including a layer of polycrystalline silicon; and wherein the second conductor layer is of polycrystalline silicon and is of an upper level conductor layer as compared to the first conductor layer.

27. A static random access memory integrated circuit device according to claim 26, wherein the first conductivity type if N-type and the second conductivity type is P-type, whereby the MISFETs of the memory cells include N-type MISFETs formed in P-type wells.

28. A static random access memory integrated circuit device according to claim 13, wherein the memory cells includes the first conductor layer, with said first conductor layer providing the gate electrodes for the MISFETs of the memory cells, the first conductor layer including a sublayer of polycrystalline silicon, and wherein the second conductor layer is made of polycrystalline silicon and is an upper level conductor layer as compared to the first conductor layer.

29. A static random access memory integrated circuit device according to claim 21, wherein the first level conductive material layer includes a sublayer of polycrystalline silicon, and wherein the second level conductive material layer is an upper level conductor layer as compared to the first level conductive material layer.

* * * * *